US010720605B2

(12) United States Patent
Kim

(10) Patent No.: US 10,720,605 B2
(45) Date of Patent: Jul. 21, 2020

(54) DEVICE WITH LIGHT EMITTING ELEMENT

(71) Applicant: LG Display Co., Ltd., Seoul (KR)

(72) Inventor: Tae-Kyung Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/555,162

(22) Filed: Aug. 29, 2019

(65) Prior Publication Data

US 2020/0075892 A1   Mar. 5, 2020

(30) Foreign Application Priority Data

Aug. 31, 2018   (KR) .......................... 10-2018-0103159

(51) Int. Cl.
*H01L 51/52* (2006.01)
*H01L 51/56* (2006.01)
*H01L 51/00* (2006.01)

(52) U.S. Cl.
CPC ...... *H01L 51/5259* (2013.01); *H01L 51/0097* (2013.01); *H01L 51/56* (2013.01); *H01L 2251/5338* (2013.01)

(58) Field of Classification Search
CPC .................... H01L 51/5259; H01L 51/0097
See application file for complete search history.

(56) References Cited

U.S. PATENT DOCUMENTS 9,054,327 B2 * 6/2015 Kim ................... H01L 51/5256
10,135,028 B2 * 11/2018 Kim ................... H01L 27/3244
10,454,061 B2 * 10/2019 Jo ....................... H01L 51/5259

FOREIGN PATENT DOCUMENTS

KR   10-2016-0069753 A   6/2016
KR   10-2016-0075063 A   6/2016
KR   10-2017-0133812 A   12/2017

* cited by examiner

*Primary Examiner* — William Coleman
(74) *Attorney, Agent, or Firm* — Morgan, Lewis & Bockius LLP

(57) ABSTRACT

A device with light emitting elements can prevent interfacial peeling of a plurality of layers. The device with light emitting elements includes: a substrate including an emission area in which the light emitting elements are arranged and a non-emission area that surrounds the emission area; a first organic film that covers the emission area and has a first modulus of elasticity; a second organic film that is disposed on the first organic film and has a second modulus of elasticity which is greater than the first modulus of elasticity; and a metal film that is disposed on the second organic film and has a third modulus of elasticity which is greater than the second modulus of elasticity.

21 Claims, 7 Drawing Sheets

DEVICE WITH LIGHT EMITTING ELEMENT

CROSS-REFERENCE TO RELATED APPLICATIONS

This application claims the benefit of and priority to Korean Patent Application No. 10-2018-0103159, filed on Aug. 31, 2018, which is hereby incorporated by reference in its entirety as if fully set forth herein.

BACKGROUND

Technical Field

The present disclosure relates to a device with light emitting elements.

Discussion of the Related Art

With advancement in information-oriented societies, demands for display devices and lighting devices have increased in various types. Recently, various types of light emitting elements have been developed. The developed light emitting elements have been applied to display devices and lighting devices.

An organic light emitting element out of such light emitting elements employs a spontaneous emission system, has a viewing angle, a contrast ratio, and the like which are excellent, and can be decreased in weight and thickness and is advantageous in power consumption because a separate backlight is not required. An organic light emitting element can be driven with a low DC voltage, has a high response speed, and has low manufacturing costs.

However, an organic light emitting element has shortage that it is likely to degrade due to external factors such as external moisture and oxygen. In order to prevent this problem, an encapsulation film that prevents external moisture and oxygen from permeating an organic light emitting element is provided on the organic light emitting element.

An encapsulation film may include a plurality of layers. In this case, barrier performance of the encapsulation film can be enhanced, but the likelihood that peeling will occur in interfaces between the plurality of layers increases. External moisture and oxygen may flow into the peeled interface. The flowing moisture and oxygen may cause failure in the organic light emitting element and cause failure in a display device and a lighting device.

SUMMARY

Accordingly, embodiments of the present disclosure are directed to a device with a light emitting element that substantially obviates one or more of the problems due to limitations and disadvantages of the related art.

An aspect of the present disclosure is to provide a device with light emitting elements that can prevent interfacial peeling between a plurality of layers of an encapsulation film.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a device with light emitting elements comprises: a substrate including an emission area in which the light emitting elements are arranged and a non-emission area that surrounds the emission area; a first organic film that covers the emission area and has a first modulus of elasticity; a second organic film that is disposed on the first organic film and has a second modulus of elasticity which is greater than the first modulus of elasticity; and a metal film that is disposed on the second organic film and has a third modulus of elasticity which is greater than the second modulus of elasticity.

According to the present disclosure, by disposing the second organic film having a modulus of elasticity which is greater than that of the first organic film and less than that of the metal film between the first organic film having a low modulus of elasticity and the metal film having a high modulus of elasticity, it is possible to relax stress at interfaces between the first organic film, the second organic film, and the metal film. Accordingly, it is possible to prevent interfacial peeling from occurring in an encapsulation film.

According to the present disclosure, by forming the second organic film in patterns in the non-emission area, a path through which moisture having permeated a side surface of the second organic film from the outside moves to the light emitting element can be cut off. According to the present disclosure, it is possible to reduce stress at interfaces between the second organic film and the metal film in the non-emission area and to effectively prevent interfacial peeling from occurring when an impact or pressure is applied to an edge.

According to the present disclosure, by forming the second organic film in patterns in the emission area, it is possible to effectively prevent interfacial peeling from occurring when a bending area is provided in the emission area.

According to the present disclosure, by forming a moisture absorbing pattern between the patterns of the second organic film, it is possible to absorb moisture having permeated a side surface of the second organic film from the outside.

According to the present disclosure, by forming the moisture absorbing pattern and the first organic film through the same process, it is possible to simplify the manufacturing processes.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION OF THE INVENTION

Figure 1:
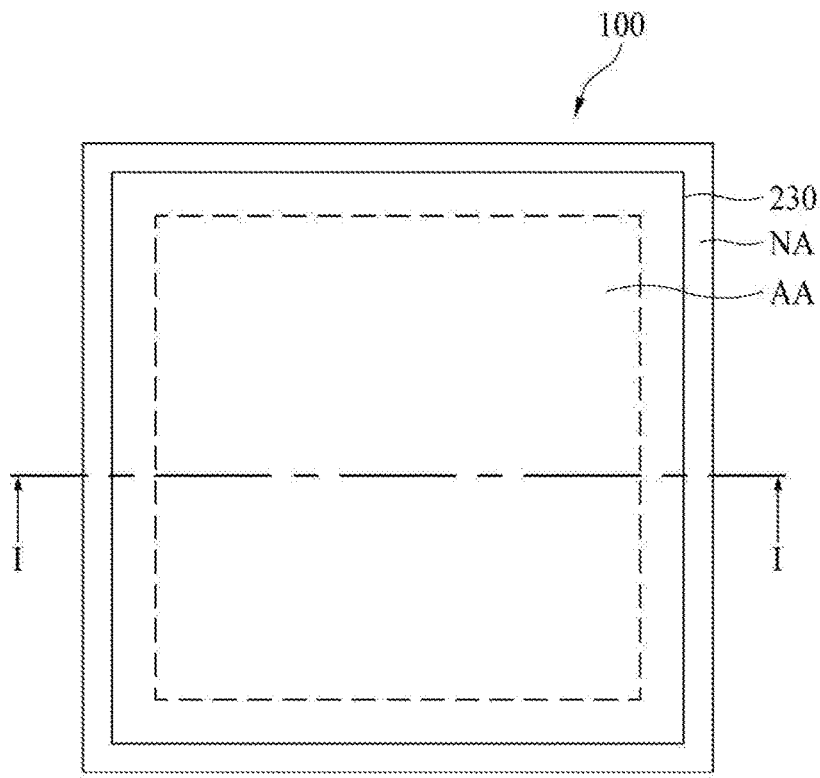
FIG. 1 is a plan view illustrating a device with light emitting elements according to a first embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a positional relationship, for example, when a position relation between two parts is described as 'on~', 'over~', 'under~' and 'next~', one or more other parts may be disposed between the two parts unless 'just' or 'direct' is used.

In describing a temporal relationship, for example, when the temporal order is described as 'after~', 'subsequent~', 'next~', and 'before~', a case which is not continuous may be included unless 'just' or 'direct' is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

An "X-axis direction," a "Y-axis direction," and a "Z-axis direction" should not be construed as a geometric relationship in which they are perpendicular to each other and mean that they have broad directivity within the scope in which elements of the present disclosure work functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of the present disclosure will be described in detail with reference to the accompanying drawings.

First Embodiment

Figure 2:
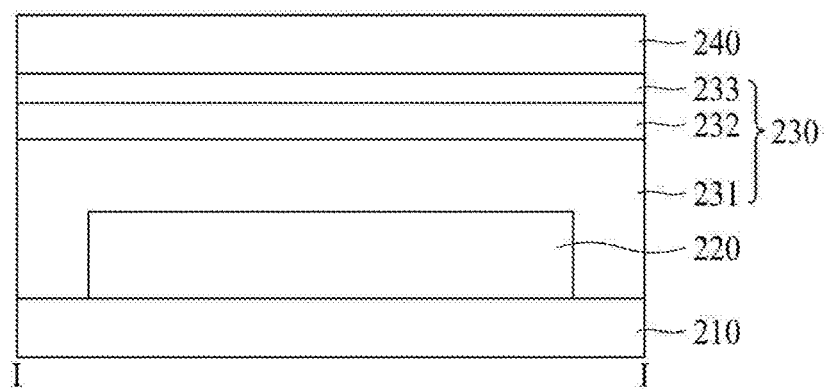
FIG. 2 is a sectional view taken along line I-I in FIG. 1.
Figure 3:
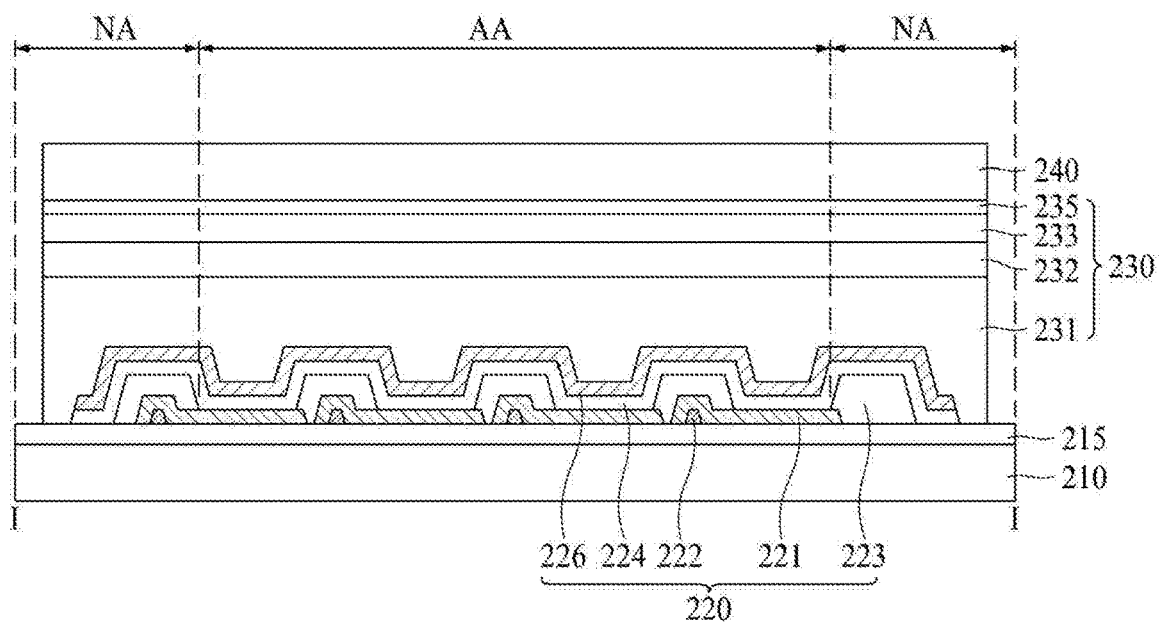
FIG. 3 is a sectional view illustrating an example of the configuration illustrated in FIG. 2.

FIG. 1 is a plan view illustrating a device with light emitting elements according to a first embodiment of the present disclosure. FIG. 2 is a sectional view taken along line I-I in FIG. 1. FIG. 3 is a sectional view illustrating an example of the configuration illustrated in FIG. 2.

With reference to FIGS. 1, 2, and 3, a device 100 with light emitting elements according to a first embodiment of the present disclosure includes a first substrate 210, a light emitting element 220, an encapsulation film 230, and a second substrate 240.

In the following description, the device 100 with light emitting elements according to the first embodiment of the present disclosure is embodied as a lighting device with organic light emitting elements, but the present disclosure is not limited thereto. The device 100 with light emitting elements according to the first embodiment of the present disclosure further includes various types of light emitting elements as well as organic light emitting elements. The device 100 with light emitting elements according to the first embodiment of the present disclosure may be embodied as a flat panel display device such as a liquid crystal display (LCD) device, a field emission display (FED) device, a plasma display panel (PDP) display device, an organic light emitting display (OLED) device, or an electrophoresis display (EPD) device.

The first substrate 210 is partitioned into an emission area AA in which light is emitted and a non-emission area NA in which light is not emitted. Here, the emission area AA includes one or more light emitting unit. The non-emission area NA is provided to surround the emission area AA including the light emitting unit as illustrated in FIG. 1. The first substrate 210 may be a plastic film, a glass substrate, or a silicon wafer which is formed through a semiconductor process. The first substrate 210 may be formed of a transparent material or may be formed of an opaque material.

The device 100 with light emitting elements according to the first embodiment of the present disclosure may employ a so-called bottom emission system in which emitted light is discharged downward. In this case, the first substrate 210 is formed of a transparent material. On the other hand, the device 100 with light emitting elements according to the first embodiment of the present disclosure may employ a so-called top emission system in which emitted light is discharged upward. In this case, the first substrate 210 is formed of an opaque material.

A buffer film 215 is provided on the first substrate 210 as illustrated in FIG. 3. The buffer film 215 is provided on one surface of the first substrate 210 to protect transistors (not illustrated) and light emitting elements 220 from moisture which permeates via the first substrate 210 which is vulnerable to moisture. The one surface of the first substrate 210 may be a surface facing the second substrate 240. The buffer film 215 is formed of a plurality of inorganic films which are alternately stacked. For example, the buffer film 215 may be formed of a multi-layered film in which one or more inorganic films of a silicon oxide film (SiOx), a silicon nitride film (SiNx), and SiON are alternately stacked. The buffer film 215 may be omitted.

Transistors (not illustrated) are provided on the first substrate 210. Each transistor includes an active layer, a gate electrode, and source and drain electrodes.

The light emitting elements 220 are provided on the first substrate 210 and the transistors. Each light emitting element 220 includes a first electrode 221, an insulating layer 223, a light emitting layer 224, and a second electrode 226. For example, the light emitting element 220 may further include an auxiliary electrode 222.

The first electrode 221 is provided on the first substrate 210 and the transistors. The first electrode 221 is connected to source electrodes of the transistors via contact holes. The first electrode 221 may be formed of a transparent material or may be formed of an opaque material.

When the device 100 with light emitting elements according to the first embodiment of the present disclosure employs a bottom emission system, the first electrode 221 is be formed of a transparent conductive material (TCO) such as ITO or IZO that can transmit light or a semi-transmissive conductive material such as magnesium (Mg), silver (Ag), or an alloy of magnesium (Mg) and silver (Ag).

A transparent conductive material has a high resistance value per unit area. In the device 100 with light emitting elements according to the first embodiment of the present disclosure, an auxiliary electrode 222 may be further provided under the first electrode 221 in order to reduce resistance of the first electrode 221. Here, the auxiliary electrode 222 is formed of an opaque metal having low sheet resistance such as copper (Cu) or aluminum (Al). In FIG. 3, the auxiliary electrode 222 is provided under the first electrode 221, but the present disclosure is not limited thereto. The auxiliary electrode 222 may be provided on the first electrode 221.

On the other hand, when the device 100 with light emitting elements according to the first embodiment of the present disclosure employs a top emission system, the first electrode 221 is formed of a metal material having high reflectance such as a stacked structure (Ti/Al/Ti) of aluminum (Al) and titanium (Ti), a stacked structure (ITO/Al/ITO) of aluminum (Al) and ITO, an APC alloy, and a stacked structure (ITO/APC/TIO) of an APC alloy and ITO. The APC alloy is an alloy of silver (Ag), palladium (Pd), and copper (Cu).

The insulating layer 223 is provided on the first electrode 221 and defines a light emitting unit. The light emitting unit is disposed in the emission area AA, and the light emitting layer 224 emits light when an electric field is provided between the first electrode 221 and the second electrode 226.

In an area in which the insulating layer 223 is provided, since an electric field is not provided between the first electrode 221 and the second electrode 226, emission of light is not generated. As a result, the light emitting unit is provided inside the area in which the insulating layer 223 is provided.

On the other hand, the first electrode 221 under the insulating layer 223 is formed in patterns of a cut-off shape. Here, the insulating layer 223 is formed between one pattern of the first electrode 221 and another pattern of the first electrode 221 adjacent thereto. The one pattern of the first electrode 221 and the other pattern of the first electrode 221 can be insulated from each other by the insulating layer 223.

The insulating layer 223 is formed of an organic film such as an acryl resin, an epoxy resin, a phenolic resin, a polyamide resin, or a polyimide resin. Alternatively, the insulating layer 223 may be formed of an inorganic film of silicon nitride, aluminum nitride, zirconium nitride, titanium nitride, hafnium nitride tantalum nitride, silicon oxide, aluminum oxide, or titanium oxide.

The light emitting layer 224 is provided on the first electrode 221 and the insulating layer 223. The light emitting layer 224 includes a hole transporting layer, at least one light emitting layer, and an electron transporting layer. In this case, when a voltage is applied to the first electrode 221 and the second electrode 226, holes and electrons move to the light emitting layer via the hole transporting layer and the electron transporting layer, respectively, and are combined in the light emitting layer to emit light.

The light emitting layer 224 is formed as a white light emitting layer that emits white light. Alternatively, the light emitting layer 224 may be formed as at least one of a red light emitting layer that emits red light, a green light emitting layer that emits green light, and a blue light emitting layer that emits blue light.

The second electrode 226 is provided on the light emitting layer 224. The second electrode 226 may be formed of a transparent material or may be formed of an opaque material.

When the device 100 with light emitting elements according to the first embodiment of the present disclosure employs a bottom emission system, the second electrode 226 is formed of a metal material having high reflectance such as a stacked structure (Ti/Al/Ti) of aluminum (Al) and titanium (Ti), a stacked structure (ITO/Al/ITO) of aluminum (Al) and ITO, an APC alloy, and a stacked structure (ITO/APC/TIO) of an APC alloy and ITO. The APC alloy is an alloy of silver (Ag), palladium (Pd), and copper (Cu).

On the other hand, when the device 100 with light emitting elements according to the first embodiment of the present disclosure employs a top emission system, the second electrode 226 is be formed of a transparent conductive material (TCO) such as ITO or IZO that can transmit light or a semi-transmissive conductive material such as magnesium (Mg), silver (Ag), or an alloy of magnesium (Mg) and silver (Ag). A capping layer (not illustrated) may be provided on the second electrode 226.

The encapsulation film 230 is provided on the second electrode 226. The encapsulation film 230 serves to prevent oxygen or moisture from permeating the light emitting element 220. For this purpose, the encapsulation film 230 includes a first organic film 231, a second organic film 232, and a metal film 233.

The first organic film 231 is disposed on the second electrode 226. The first organic film 231 is provided to cover the emission area AA and can be provided particularly to cover the second electrode 226. The first organic film 231 has a first modulus of elasticity. For example, the first organic film 231 may be formed of olefin.

The second organic film 232 is disposed on the first organic film 231 and has a second modulus of elasticity which is greater than the first modulus of elasticity. For example, the second organic film 232 may include one or more kinds of an acryl resin, an epoxy resin, a phenolic resin, a polyamide resin, and a polyimide resin, but the present disclosure is not limited thereto. The second organic film 232 has only to be an organic film having a modulus of elasticity which is greater than that of the first organic film 231.

The metal film 233 is disposed on the second organic film 232 and has a third modulus of elasticity which is greater than the second modulus of elasticity. For example, the metal film 233 may include one or more kinds of copper (Cu), zinc (Zn), iron (Fe), aluminum (Al), and molybdenum (Mo), but the present disclosure is not limited thereto.

The metal film 233 generally has a high modulus of elasticity. For example, the modulus of elasticity of copper (Cu) is 45,038 N/mm2. Accordingly, the metal film 233 is subjected to great stress due to an external pressure or impact.

On the other hand, the first organic film 231 has a low modulus of elasticity. For example, the modulus of elasticity of olefin is 14.02 N/mm2. When the metal film 233 is deposited directly on the first organic film 231, a difference in modulus of elasticity between the first organic film 231 and the metal film 233 is great and thus there is a high likelihood that interfacial peeling will occur between the first organic film 231 and the metal film 233. In this case, moisture or oxygen permeates the peeled interface and damages the light emitting element 220 such that emission of light will not be carried out well.

This problem becomes much severer when it is intended to realize flexible characteristics in the device 100 with light emitting elements. A bending area may be provided in a flexible device. In the bending area, the metal film 233 is subjected to great stress and stress is generated at an interface between the first organic film 231 and the metal film 233 which have a great difference in modulus of elasticity. Accordingly, interfacial peeling occurs between the first organic film 231 and the metal film 233.

The device 100 with light emitting elements according to the first embodiment of the present disclosure is technically characterized in that the second organic film 232 is provided between the first organic film 231 and the metal film 233. Here, the second organic film 232 is formed of an organic material having a modulus of elasticity which is greater than the modulus of elasticity of the first organic film 231 and less than the modulus of elasticity of the metal film 233.

The difference in modulus of elasticity between the second organic film 232 and the metal film 233 is less than the difference in modulus of elasticity between the first organic film 231 and the metal film 233. Accordingly, when an external pressure or impact is applied thereto, the stress at an interface at which the second organic film 232 and the metal film 233 are in direct contact with each other is less than the stress at an interface at which the first organic film 231 and the metal film 233 are in direct contact with each other.

The difference in modulus of elasticity between the first organic film 231 and the second organic film 232 is less than the difference in modulus of elasticity between the first organic film 231 and the metal film 233. Accordingly, when an external pressure or impact is applied thereto, the stress at an interface at which the first organic film 231 and the second organic film 232 are in direct contact with each other is less than the stress at an interface at which the first organic film 231 and the metal film 233 are in direct contact with each other.

Accordingly, in the device 100 with light emitting elements according to the first embodiment of the present disclosure, it is possible to reduce the stress at the interfaces between the first organic film 231, the second organic film 232, and the metal film 233 and to prevent occurrence of interfacial peeling.

The second substrate 240 may be a plastic film or a glass substrate. The second substrate 240 may be formed of a transparent material or may be formed of an opaque material.

The device 100 with light emitting elements according to the first embodiment of the present disclosure may employ a so-called bottom emission system in which emitted light is discharged downward. In this case, the second substrate 240 is formed of an opaque material. On the other hand, the device 100 with light emitting elements according to the first embodiment of the present disclosure may employ a so-called top emission system in which emitted light is discharged upward. In this case, the second substrate 240 is formed of a transparent material.

The second substrate 240 is bonded to the first substrate 210 on which the encapsulation film 230 is formed using an adhesive layer 235. Alternatively, the second substrate 240 on which the metal film 233 and the second organic film 232 are formed may be bonded to the first substrate 210 on which the first organic film 231. Here, the second organic film 232 of the second substrate 240 and the first organic film 231 of the first substrate 210 are bonded to each other.

Second Embodiment

Figure 4:
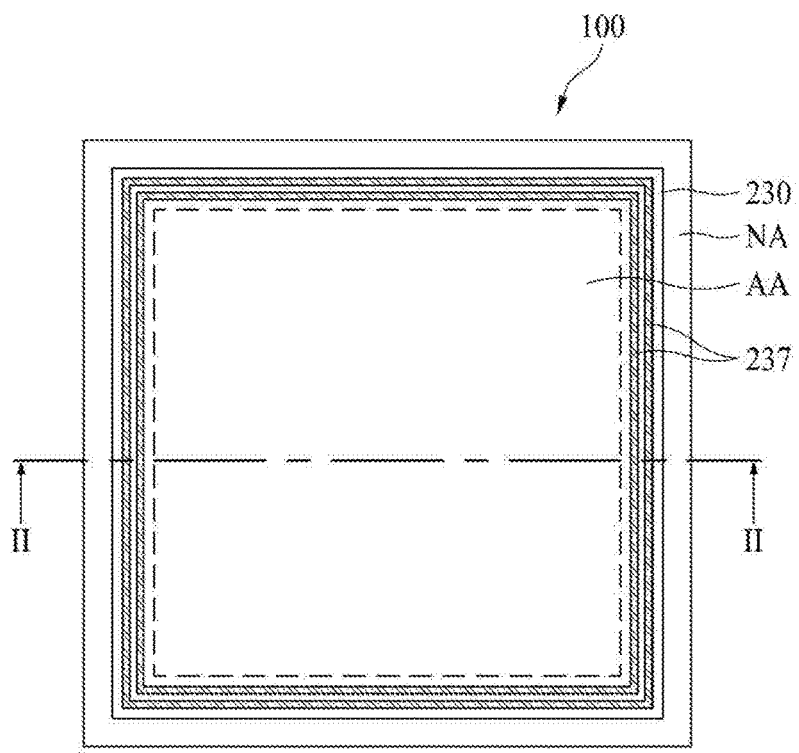
FIG. 4 is a plan view illustrating a device with light emitting elements according to a second embodiment of the present disclosure.
Figure 5:
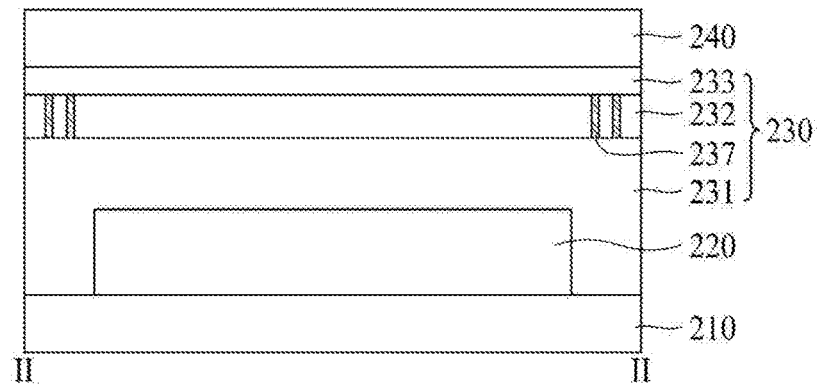
FIG. 5 is a sectional view taken along line II-II in FIG. 4.
Figure 6:
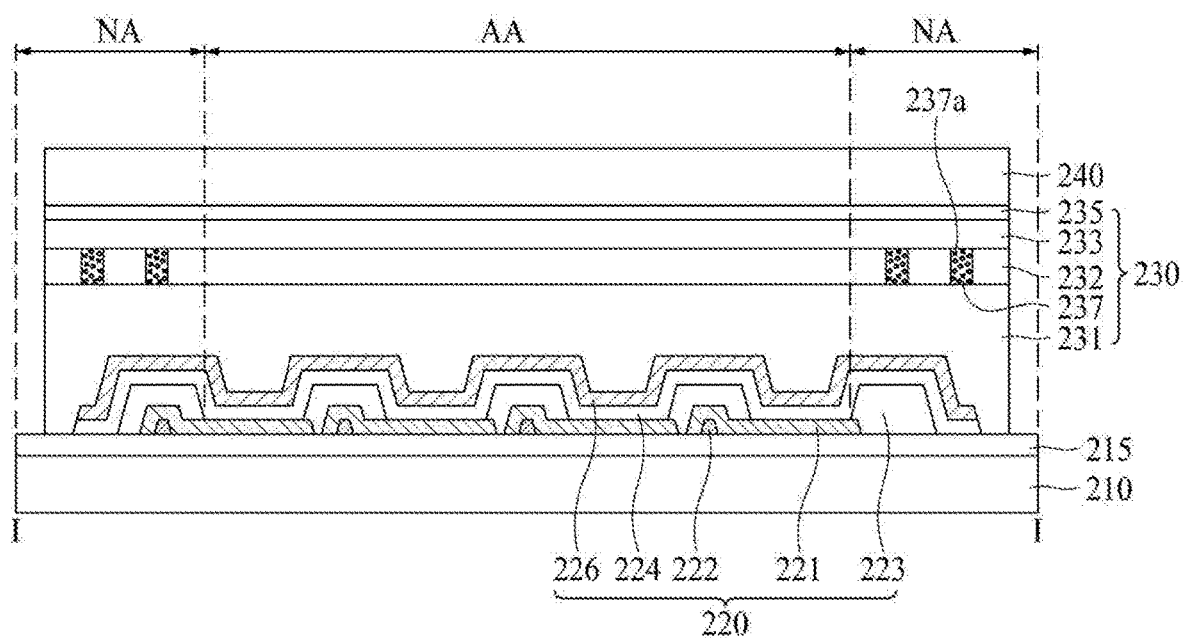
FIG. 6 is a sectional view illustrating an example of the configuration illustrated in FIG. 5.
Figure 7:
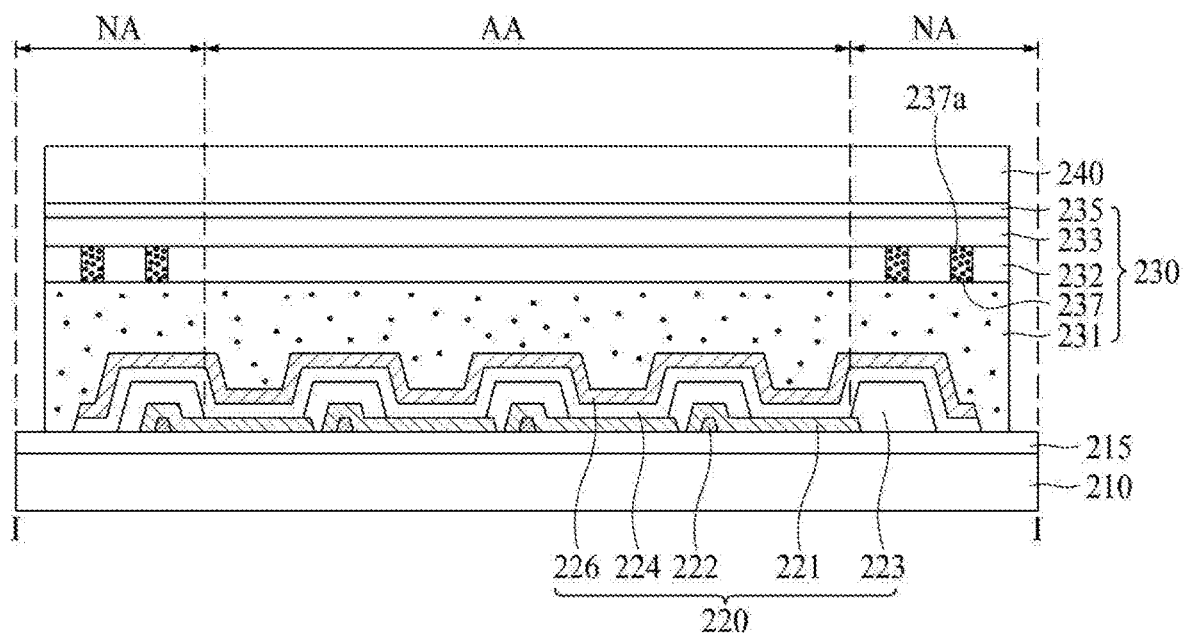
FIG. 7 is a sectional view illustrating a modified example of the configuration illustrated in FIG. 6.
Figure 8:
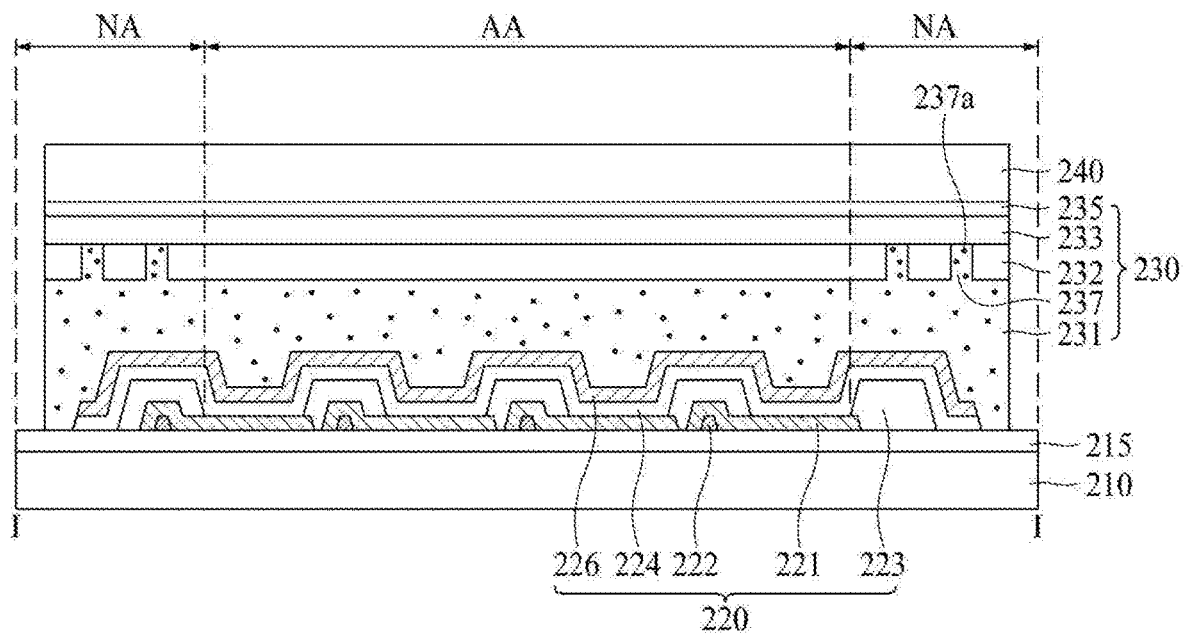
FIG. 8 is a sectional view illustrating another modified example of the configuration illustrated in FIG. 6.
Figure 9:
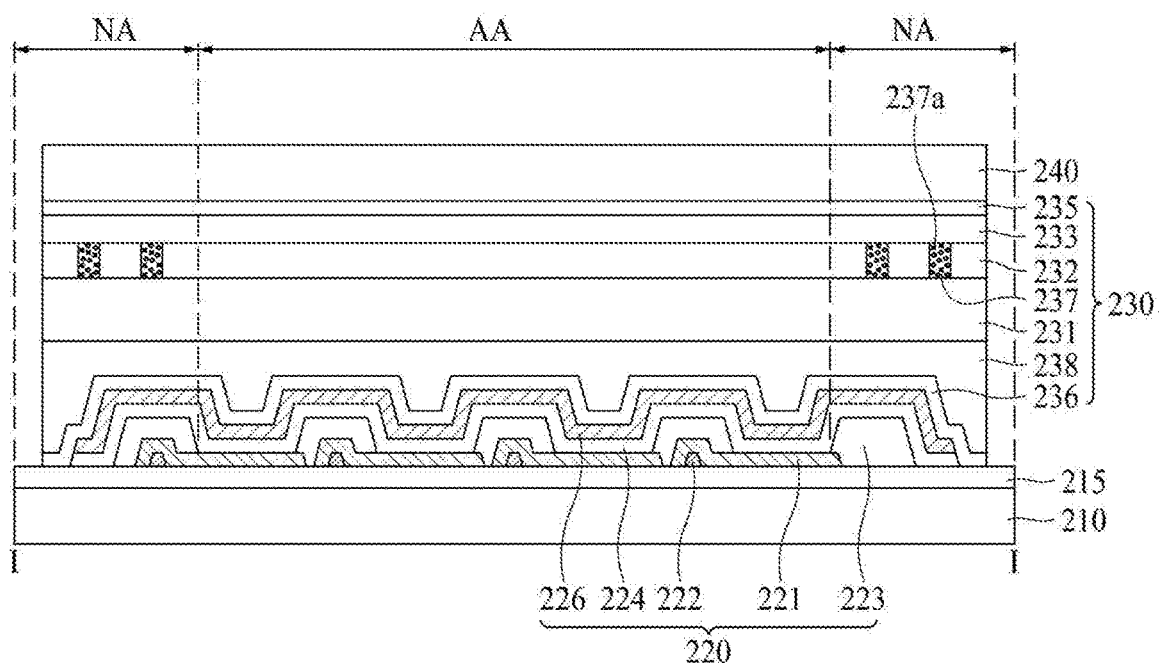
FIG. 9 is a sectional view illustrating still another modified example.

FIG. 4 is a plan view illustrating a device with light emitting elements according to a second embodiment of the present disclosure. FIG. 5 is a sectional view taken along line II-II in FIG. 4. FIG. 6 is a sectional view illustrating an example of the configuration illustrated in FIG. 5. FIG. 7 is a sectional view illustrating a modified example of the configuration illustrated in FIG. 6. FIG. 8 is a sectional view illustrating another modified example of the configuration illustrated in FIG. 6. FIG. 9 is a sectional view illustrating still another modified example.

With reference to FIGS. 4, 5, and 6, a device 100 with light emitting elements according to a second embodiment of the present disclosure includes a first substrate 210, a light emitting element 220, an encapsulation film 230, and a second substrate 240.

The first substrate 210, the light emitting element 220, and the second substrate 240 in the device 100 with light emitting elements according to the second embodiment of the present disclosure are substantially the same as the first substrate 210, the light emitting element 220, and the second substrate 240 in the device 100 with light emitting elements according to the first embodiment of the present disclosure and thus detailed description thereof will not be repeated.

In the following description, the device 100 with light emitting elements according to the second embodiment of the present disclosure is embodied as a lighting device, but the present disclosure is not limited thereto. The device 100 with light emitting elements according to the second embodiment of the present disclosure may be embodied as a flat panel display device such as a liquid crystal display (LCD) device, a field emission display (FED) device, a plasma display panel (PDP) display device, an organic light emitting display (OLED) device, or an electrophoresis display (EPD) device.

The encapsulation film 230 is provided on the second electrode 226. The encapsulation film 230 serves to prevent oxygen or moisture from permeating the light emitting element 220. For this purpose, the encapsulation film 230 includes a first organic film 231, a second organic film 232, a metal film 233, and a moisture absorbing pattern 237.

The first organic film 231 is disposed on the second electrode 226 and is provided to cover the second electrode 226. The first organic film 231 has a first modulus of elasticity. For example, the first organic film 231 may be formed of olefin.

The second organic film 232 is disposed on the first organic film 231 and has a second modulus of elasticity which is greater than the first modulus of elasticity. For example, the second organic film 232 may include one or more kinds of an acryl resin, an epoxy resin, a phenolic resin, a polyamide resin, and a polyimide resin, but the present disclosure is not limited thereto. The second organic film 232 has only to be an organic film having a modulus of elasticity which is greater than that of the first organic film 231.

The second organic film 232 is formed in patterns in the non-emission area NA. Since the metal film 233 is disposed on the second organic film 232, moisture does not permeate the top surface of the second organic film 232. However, since the metal film 233 is not provided on the side surface of the second organic film 232, moisture can permeate the side surface of the second organic film 232. When moisture permeates the side surface of the second organic film 232 from the outside, the permeating moisture can move to the light emitting element 220 along the second organic film 232 and the first organic film 231. The light emitting element 220 which is exposed to moisture may be damaged to cause failure.

In the device 100 with light emitting elements according to the second embodiment of the present disclosure, by forming the second organic film 232 in patterns in the non-emission area NA, a path through which moisture having permeated a side surface of the second organic film 232 from the outside moves to the light emitting element 220 can be cut off.

In the device 100 with light emitting elements according to the second embodiment of the present disclosure, the area in which the second organic film 232 and the metal film 233 are in direct contact with each other in the non-emission area NA can be reduced. Accordingly, with the device 100 with light emitting elements according to the second embodiment of the present disclosure, it is possible to reduce stress at an interface between the second organic film 232 and the metal film 233 in the non-emission area NA and to effectively prevent occurrence of interfacial peeling when an impact or pressure is applied to an edge thereof.

The moisture absorbing pattern 237 is provided between the patterns of the second organic film 232 provided in the non-emission area NA. The moisture absorbing pattern 237 has a rectangular ring shape as illustrated in FIG. 4 and at least one moisture absorbing pattern is provided. When a plurality of moisture absorbing patterns 237 are provided, at least one of the plurality of moisture absorbing patterns 237 is provided to surround the emission area AA. The moisture absorbing pattern 237 can prevent moisture from moving to the light emitting element 220 by absorbing the moisture having permeated the side surface of the second organic film 232 from the outside. The moisture absorbing pattern 237 may include a getter 237a for absorbing moisture.

In FIG. 6, the getter 237a is disposed in only the moisture absorbing pattern 237, but the present disclosure is not limited thereto.

For example, the first organic film 231 may include an organic material such as olefin and a getter as illustrated in FIG. 7. The second organic film 232 is disposed on the top surface of the first organic film 231. Accordingly, moisture having permeated the second organic film 232 can move to the first organic film 231. Moisture may also permeate a side surface of the first organic film 231. Since the first organic film 231 includes the getter, permeating moisture is absorbed to prevent moisture from permeating the light emitting element 220.

On the other hand, the moisture absorbing pattern 237 and the first organic film 231 are provided in different layers in FIG. 6, but the present disclosure is not limited thereto.

For example, the moisture absorbing pattern 237 and the first organic film 231 may be formed as a unified configuration as illustrated in FIG. 8. The moisture absorbing pattern 237 and the first organic film 231 may be formed of the same material. The moisture absorbing pattern 237 and the first organic film 231 may be formed of an organic material, for example, olefin and a getter.

The moisture absorbing pattern 237 and the first organic film 231 may be formed through the same process. More specifically, the light emitting element 220 and the first organic film 231 are sequentially formed on the first substrate 210. Then, the metal film 233 and the second organic film 232 are sequentially formed on the second substrate 240. Here, the second organic film 232 is formed in patterns in the non-emission area NA. Then, the first substrate 210 on which the first organic film 231 is formed and the second substrate 240 on which the second organic film 232 is formed are bonded to each other. The first organic film 231 of the first substrate 210 and the second organic film 232 of the second substrate 240 are bonded to each other while facing each other. Here, since the second organic film 232 is formed in patterns in the non-emission area NA, the first organic film 231 is interposed between the patterns of the second organic film 232 to form the moisture absorbing pattern 237. In this example, it is possible to simplify the manufacturing processes by forming the moisture absorbing pattern 237 and the first organic film 231 using the same material and the same process.

The metal film 233 is disposed on the second organic film 232 and has a third modulus of elasticity which is greater than the second modulus of elasticity. For example, the metal film 233 may include one or more kinds of copper (Cu), zinc (Zn), iron (Fe), aluminum (Al), and molybdenum (Mo), but the present disclosure is not limited thereto.

The metal film 233 generally has a high modulus of elasticity. For example, the modulus of elasticity of copper (Cu) is 45,038 N/mm2. Accordingly, the metal film 233 is subjected to great stress due to an external pressure or impact.

On the other hand, the first organic film 231 has a low modulus of elasticity. For example, the modulus of elasticity of olefin is 14.02 N/mm2. When the metal film 233 is deposited directly on the first organic film 231, a difference in modulus of elasticity between the first organic film 231 and the metal film 233 is great and thus there is a high likelihood that interfacial peeling will occur between the first organic film 231 and the metal film 233. In this case, moisture or oxygen permeates the peeled interface and damages the light emitting element 220 such that emission of light will not be carried out well.

This problem becomes much severer when it is intended to realize flexible characteristics in the device 100 with light emitting elements. A bending area may be formed in a flexible device. In the bending area, the metal film 233 is subjected to great stress and stress is generated at an interface between the first organic film 231 and the metal film 233 which have a great difference in modulus of elasticity. Accordingly, interfacial peeling occurs between the first organic film 231 and the metal film 233.

The device 100 with light emitting elements according to the second embodiment of the present disclosure is technically characterized in that the second organic film 232 is provided between the first organic film 231 and the metal film 233. Here, the second organic film 232 is formed of an organic material having a modulus of elasticity which is greater than the modulus of elasticity of the first organic film 231 and less than the modulus of elasticity of the metal film 233.

The difference in modulus of elasticity between the second organic film 232 and the metal film 233 is less than the difference in modulus of elasticity between the first organic film 231 and the metal film 233. Accordingly, when an external pressure or impact is applied thereto, the stress at an interface at which the second organic film 232 and the metal film 233 are in direct contact with each other is less than the stress at an interface at which the first organic film 231 and the metal film 233 are in direct contact with each other.

The difference in modulus of elasticity between the first organic film 231 and the second organic film 232 is less than the difference in modulus of elasticity between the first organic film 231 and the metal film 233. Accordingly, when an external pressure or impact is applied thereto, the stress at an interface at which the first organic film 231 and the second organic film 232 are in direct contact with each other is less than the stress at an interface at which the first organic film 231 and the metal film 233 are in direct contact with each other.

Accordingly, in the device 100 with light emitting elements according to the second embodiment of the present disclosure, it is possible to reduce the stress at the interfaces between the first organic film 231, the second organic film 232, and the metal film 233 and to prevent occurrence of interfacial peeling.

In FIG. 6, the first organic film 231 is provided directly on the second electrode 226, but the present disclosure is not limited thereto.

For example, the encapsulation film 230 may further include at least one of a capping layer 236 and a third organic film 238 as illustrated in FIG. 9. The capping layer 236 is provided on the second electrode 226 to protect the second electrode 226. For example, the capping layer 236 may be formed of a multi-layered film in which one or more inorganic films of a silicon oxide film (SiOx), a silicon nitride film (SiNx), and SiON are alternately stacked. The third organic film 238 may be provided under the first organic film 231. Here, the third organic film 238 may include one or more kinds of an acryl resin, an epoxy resin, a phenolic resin, a polyamide resin, and a polyimide resin and may be formed of a material different from that of the second organic film 232 or may be formed of the same material as the second organic film 232.

Third Embodiment

Figure 10:
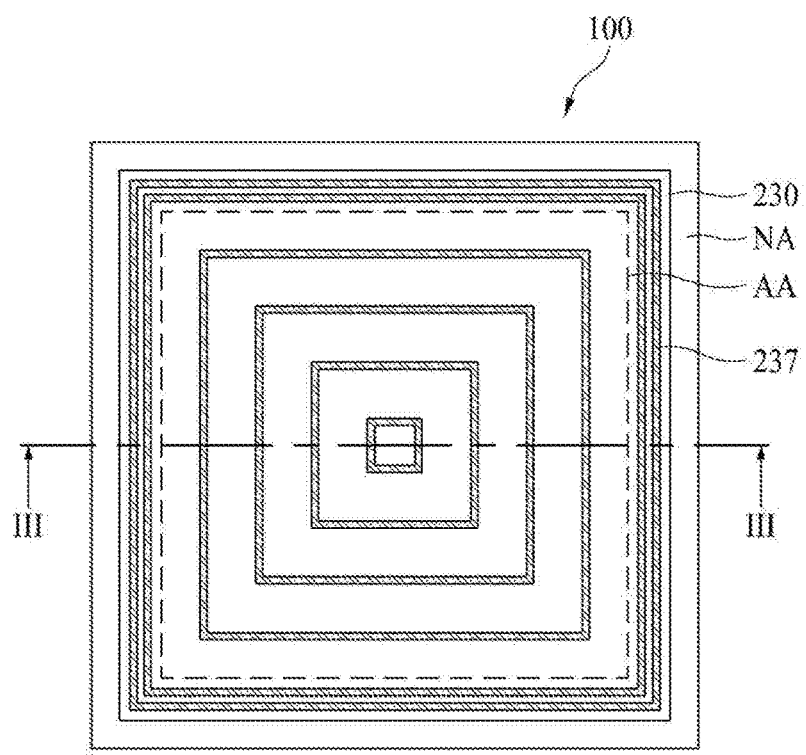
FIG. 10 is a plan view illustrating a device with light emitting elements according to a third embodiment of the present disclosure.
Figure 11:
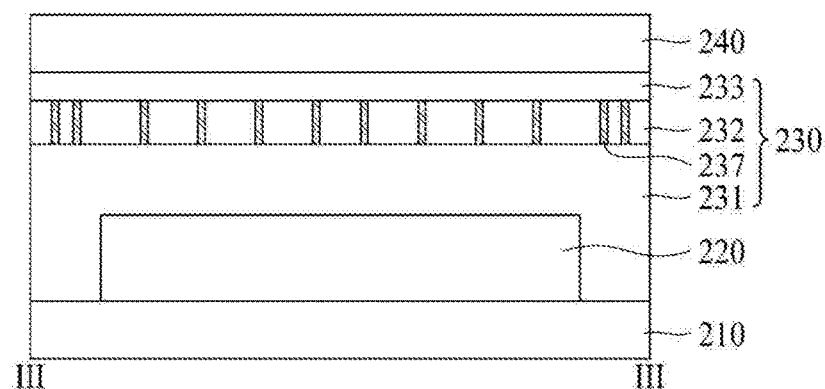
FIG. 11 is a sectional view taken along line in FIG. 10.
Figure 12:
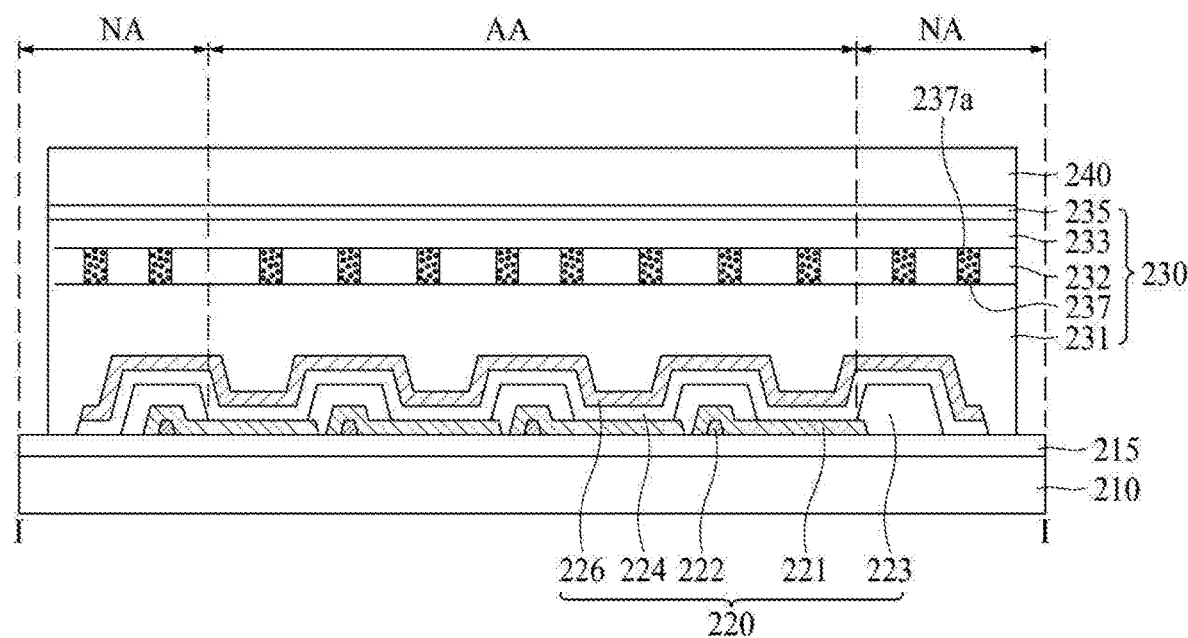
FIG. 12 is a sectional view illustrating an example of the configuration illustrated in FIG. 11.

FIG. 10 is a plan view illustrating a device with light emitting elements according to a third embodiment of the present disclosure. FIG. 11 is a sectional view taken along line III-III in FIG. 10. FIG. 12 is a sectional view illustrating an example of the configuration illustrated in FIG. 11.

With reference to FIGS. 10, 11, and 12, a device 100 with light emitting elements according to a third embodiment of the present disclosure includes a first substrate 210, a light emitting element 220, an encapsulation film 230, and a second substrate 240.

The first substrate 210, the light emitting element 220, and the second substrate 240 in the device 100 with light emitting elements according to the third embodiment of the present disclosure are substantially the same as the first substrate 210, the light emitting element 220, and the second substrate 240 in the device 100 with light emitting elements according to the first embodiment of the present disclosure and thus detailed description thereof will not be repeated.

In the following description, the device 100 with light emitting elements according to the third embodiment of the present disclosure is embodied as a lighting device, but the present disclosure is not limited thereto. The device 100 with light emitting elements according to the third embodiment of the present disclosure may be embodied as a flat panel display device such as a liquid crystal display (LCD) device, a field emission display (FED) device, a plasma display panel (PDP) display device, an organic light emitting display (OLED) device, or an electrophoresis display (EPD) device.

The encapsulation film 230 is provided on the second electrode 226. The encapsulation film 230 serves to prevent oxygen or moisture from permeating the light emitting element 220. For this purpose, the encapsulation film 230 includes a first organic film 231, a second organic film 232, a metal film 233, and a moisture absorbing pattern 237.

The first organic film 231 is disposed on the second electrode 226 and is provided to cover the second electrode 226. The first organic film 231 has a first modulus of elasticity. For example, the first organic film 231 may be formed of olefin.

The second organic film 232 is disposed on the first organic film 231 and has a second modulus of elasticity which is greater than the first modulus of elasticity. For example, the second organic film 232 may include one or more kinds of an acryl resin, an epoxy resin, a phenolic resin, a polyamide resin, and a polyimide resin, but the present disclosure is not limited thereto. The second organic film 232 has only to be an organic film having a modulus of elasticity which is greater than that of the first organic film 231.

The second organic film 232 is formed in patterns in the emission area AA and the non-emission area NA. Since the metal film 233 is disposed on the top surface of the second organic film 232, moisture does not permeate the top surface of the second organic film 232. However, since the metal film 233 is not formed on the side surface of the second organic film 232, moisture can permeate the side surface of the second organic film 232. When moisture permeates the side surface of the second organic film 232 from the outside, the permeating moisture can move to the light emitting element 220 along the second organic film 232 and the first organic film 231. The light emitting element 220 which is exposed to moisture may be damaged to cause failure.

In the device 100 with light emitting elements according to the third embodiment of the present disclosure, by forming the second organic film 232 in patterns in the non-emission area NA, a path through which moisture having permeated a side surface of the second organic film 232 from the outside moves to the light emitting element 220 can be cut off.

In the device 100 with light emitting elements according to the third embodiment of the present disclosure, the area in which the second organic film 232 and the metal film 233 are in direct contact with each other in the non-emission area NA can be reduced. Accordingly, with the device 100 with light emitting elements according to the third embodiment of the present disclosure, it is possible to reduce stress at an interface between the second organic film 232 and the metal film 233 in the non-emission area NA and to effectively prevent occurrence of interfacial peeling when an impact or pressure is applied to an edge thereof.

In addition, in the device 100 with light emitting elements according to the third embodiment of the present disclosure, the second organic film 232 can be formed in patterns in the emission area AA. In the device 100 with light emitting elements according to the third embodiment of the present disclosure, the area in which the second organic film 232 and the metal film 233 are in direct contact with each other in the emission area AA can be reduced. Accordingly, with the device 100 with light emitting elements according to the third embodiment of the present disclosure, it is possible to reduce stress at an interface between the second organic film 232 and the metal film 233 in the emission area AA. In the device 100 with light emitting elements according to the third embodiment of the present disclosure, it is possible to effectively prevent occurrence of interfacial peeling when a bending area is provided in the emission area AA. This effect can become more remarkable in a flexible device.

The moisture absorbing pattern 237 is provided between the patterns of the second organic film 232 provided in the emission area AA and the non-emission area NA. The moisture absorbing pattern 237 has a rectangular ring shape as illustrated in FIG. 10 and at least one moisture absorbing pattern is provided. When a plurality of moisture absorbing patterns 237 are provided, at least one of the plurality of moisture absorbing patterns 237 is provided to surround the emission area AA. The moisture absorbing pattern 237 can prevent moisture from moving to the light emitting element 220 by absorbing the moisture having permeated the side surface of the second organic film 232 from the outside. The moisture absorbing pattern 237 may include a getter 237*a* for absorbing moisture.

The moisture absorbing patterns 237 may be arranged at the same intervals or at different intervals. In general, moisture permeates the non-emission area NA and permeates the emission area AA from the non-emission area NA. In consideration of this point, the moisture absorbing patterns 237 may be provided in the non-emission area NA at intervals which are less than those in the emission area AA as illustrated in FIG. 10

On the other hand, the moisture absorbing patterns 237 are provided in the emission area AA as well as in the non-emission area NA, but the present disclosure is not limited thereto. For example, the moisture absorbing patterns 237 may be provided in only the non-emission area NA.

In FIG. 12, the getter 237*a* is disposed in only the moisture absorbing patterns 237, but the present disclosure is not limited thereto.

For example, the first organic film 231 may include an organic material such as olefin and a getter as illustrated in FIG. 7. The second organic film 232 is disposed on the top surface of the first organic film 231. Accordingly, moisture having permeated the second organic film 232 can move to the first organic film 231. Moisture may also permeate a side surface of the first organic film 231. Since the first organic film 231 includes the getter, permeating moisture is absorbed to prevent moisture from permeating the light emitting element 220.

On the other hand, the moisture absorbing pattern 237 and the first organic film 231 are provided in different layers in FIG. 12, but the present disclosure is not limited thereto.

For example, the moisture absorbing pattern 237 and the first organic film 231 may be formed as a unified configuration as illustrated in FIG. 8. The moisture absorbing pattern 237 and the first organic film 231 may be formed of the same material. The moisture absorbing pattern 237 and the first organic film 231 may be formed of an organic material, for example, olefin and a getter.

The moisture absorbing pattern 237 and the first organic film 231 may be formed through the same process. More specifically, the light emitting element 220 and the first organic film 231 are sequentially formed on the first substrate 210. Then, the metal film 233 and the second organic film 232 are sequentially formed on the second substrate 240. Here, the second organic film 232 is formed in patterns in the non-emission area NA. Then, the first substrate 210 on which the first organic film 231 is formed and the second substrate 240 on which the second organic film 232 is formed are bonded to each other. The first organic film 231 of the first substrate 210 and the second organic film 232 of the second substrate 240 are bonded to each other while facing each other. Here, since the second organic film 232 is formed in patterns in the non-emission area NA, the first organic film 231 is interposed between the patterns of the second organic film 232 to form the moisture absorbing pattern 237. In this example, it is possible to simplify the manufacturing processes by forming the moisture absorbing pattern 237 and the first organic film 231 using the same material and the same process.

The metal film 233 is disposed on the second organic film 232 and has a third modulus of elasticity which is greater than the second modulus of elasticity. For example, the metal film 233 may include one or more kinds of copper (Cu), zinc (Zn), iron (Fe), aluminum (Al), and molybdenum (Mo), but the present disclosure is not limited thereto.

The metal film 233 generally has a high modulus of elasticity. For example, the modulus of elasticity of copper (Cu) is 45,038 N/mm2. Accordingly, the metal film 233 is subjected to great stress due to an external pressure or impact.

On the other hand, the first organic film 231 has a low modulus of elasticity. For example, the modulus of elasticity of olefin is 14.02 N/mm2. When the metal film 233 is deposited directly on the first organic film 231, a difference in modulus of elasticity between the first organic film 231 and the metal film is great and thus there is a high likelihood that interfacial peeling will occur between the first organic film 231 and the metal film 233. In this case, moisture or oxygen permeates the peeled interface and damages the light emitting element 220 such that emission of light will not be carried out well.

This problem becomes much severer when it is intended to realize flexible characteristics in the device 100 with light emitting elements. A bending area may be formed in a flexible device. In the bending area, the metal film 233 is subjected to great stress and stress is generated at an interface between the first organic film 231 and the metal film 233 which have a great difference in modulus of elasticity. Accordingly, interfacial peeling occurs between the first organic film 231 and the metal film 233.

The device 100 with light emitting elements according to the third embodiment of the present disclosure is technically characterized in that the second organic film 232 is provided between the first organic film 231 and the metal film 233. Here, the second organic film 232 is formed of an organic material having a modulus of elasticity which is greater than the modulus of elasticity of the first organic film 231 and less than the modulus of elasticity of the metal film 233.

The difference in modulus of elasticity between the second organic film 232 and the metal film 233 is less than the difference in modulus of elasticity between the first organic film 231 and the metal film 233. Accordingly, when an external pressure or impact is applied thereto, the stress at an interface at which the second organic film 232 and the metal film 233 are in direct contact with each other is less than the stress at an interface at which the first organic film 231 and the metal film 233 are in direct contact with each other.

The difference in modulus of elasticity between the first organic film 231 and the second organic film 232 is less than the difference in modulus of elasticity between the first organic film 231 and the metal film 233. Accordingly, when an external pressure or impact is applied thereto, the stress at an interface at which the first organic film 231 and the second organic film 232 are in direct contact with each other is less than the stress at an interface at which the first organic film 231 and the metal film 233 are in direct contact with each other.

Accordingly, in the device 100 with light emitting elements according to the third embodiment of the present disclosure, it is possible to reduce the stress at the interfaces between the first organic film 231, the second organic film 232, and the metal film 233 and to prevent occurrence of interfacial peeling.

In FIG. 12, the first organic film 231 is provided directly on the second electrode 226, but the present disclosure is not limited thereto.

For example, the encapsulation film 230 may further include at least one of an inorganic film 236 and a third organic film 238. The inorganic film 236 is provided on the second electrode 226 to protect the second electrode 226. For example, the inorganic film 236 may be formed of a multi-layered film in which one or more inorganic films of a silicon oxide film (SiOx), a silicon nitride film (SiNx), and SiON are alternately stacked. The third organic film 238 may be provided under the first organic film 231. Here, the third organic film 238 may include one or more kinds of an acryl resin, an epoxy resin, a phenolic resin, a polyamide resin, and a polyimide resin, and may be formed of a material different from that of the second organic film 232 or may be formed of the same material as the second organic film 232.

Figure 13:
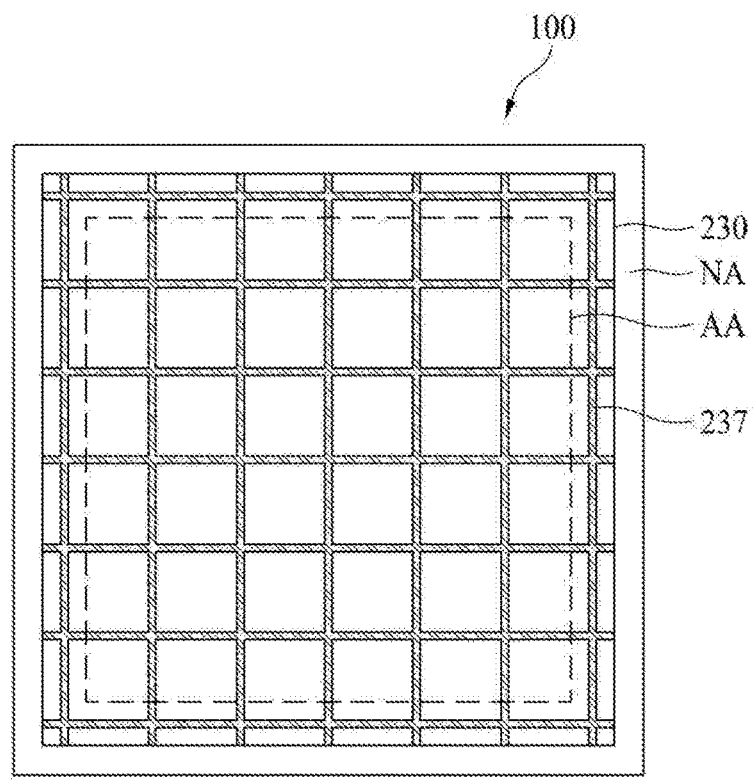
FIG. 13 is a plan view illustrating a device with light emitting elements according to another embodiment of the present disclosure.

On the other hand, the moisture absorbing patterns 237 illustrated in FIGS. 4 and 10 are provided in a rectangular ring shape, but the present disclosure is not limited thereto. The moisture absorbing patterns 237 have only to include at least one pattern surrounding the emission area AA. For example, the moisture absorbing patterns 237 may be provided in a lattice pattern as illustrated in FIG. 13.

Figure 14:
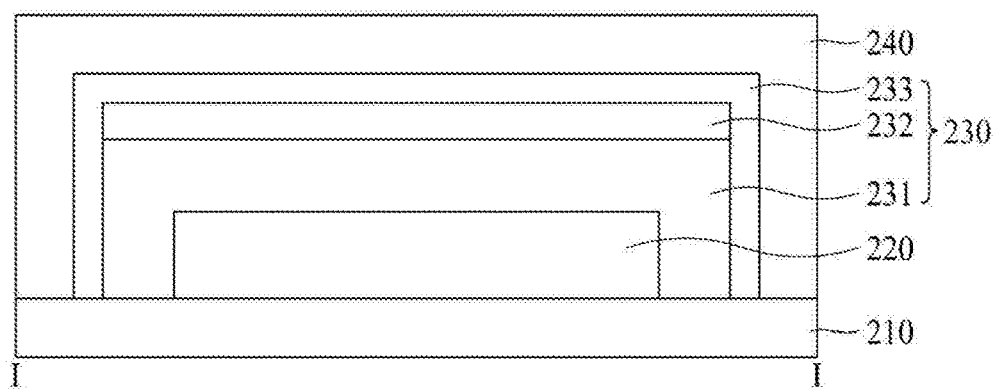
FIG. 14 is a sectional view illustrating a device with light emitting elements according to still another embodiment of the present disclosure.

In FIGS. 3, 6, 9, and 12, the areas of the first organic film 231, the second organic film 232 and the metal film 233 are the same, but the present disclosure is not limited thereto. For example, the metal film 233 may also be provided on a side surface of at least one of the first organic film 231 and the second organic film 232. For example, the second substrate 240 and the metal film 233 may be provided on the side surface of at least one of the first organic film 231 and the second organic film 232 as illustrated in FIG. 14. Accordingly, it is possible to prevent moisture from permeating the side surface of the first organic film 231 or the second organic film 232.

It will be apparent to those skilled in the art that various modifications and variations can be made in the device with a light emitting element of the present disclosure without departing from the technical idea or scope of the disclosure. Thus, it is intended that the present disclosure cover the modifications and variations of this disclosure provided they come within the scope of the appended claims and their equivalents.

What is claimed is:

1. A device with light emitting elements, comprising:
   a substrate including an emission area in which the light emitting elements are arranged and a non-emission area that surrounds the emission area;
   a first organic film that covers the emission area and has a first modulus of elasticity;
   a second organic film that is disposed on the first organic film and has a second modulus of elasticity which is greater than the first modulus of elasticity; and
   a metal film that is disposed on the second organic film and has a third modulus of elasticity which is greater than the second modulus of elasticity.

2. The device with light emitting elements according to claim 1, wherein the second organic film is provided in patterns.

3. The device with light emitting elements according to claim 1, wherein the first organic film is formed of olefin.

4. The device with light emitting elements according to claim 1, wherein the first organic film is formed of olefin and a getter.

5. The device with light emitting elements according to claim 1, wherein the metal film is provided on a side surface of at least one of the first organic film and the second organic film.

6. The device with light emitting elements according to claim 1, further comprising a third organic film that is disposed under the first organic film and has the second modulus of elasticity.

7. The device with light emitting elements according to claim 1, further comprising an inorganic film that is disposed under the first organic film.

8. The device with light emitting elements according to claim 1, wherein the metal film is formed of an opaque metal.

9. The device with light emitting elements according to claim 2, wherein the second organic film is provided in patterns in the non-emission area.

10. The device with light emitting elements according to claim 2, wherein the second organic film is provided in patterns in the emission area and the non-emission area.

11. The device with light emitting elements according to claim 2, further comprising a moisture absorbing pattern that is disposed between the patterns of the second organic film and includes a getter.

12. The device with light emitting elements according to claim 10, wherein the substrate includes a bending area.

13. The device with light emitting elements according to claim 11, wherein the first organic film and the moisture absorbing pattern are formed of the same material.

14. The device with light emitting elements according to claim 11, wherein the first organic film and the moisture absorbing pattern are formed through the same process.

15. The device with light emitting elements according to claim 11, wherein the moisture absorbing pattern include a plurality of moisture absorbing patterns, and at least one of the plurality of moisture absorbing patterns surrounds the emission area.

16. The device with light emitting elements according to claim 15, wherein the moisture absorbing patterns are disposed in the emission area and the non-emission area, and the moisture absorbing patterns are arranged at the same intervals or at different intervals.

17. The device with light emitting elements according to claim 16, wherein the intervals of the moisture absorbing patterns provided in the non-emission area are less than the intervals of the moisture absorbing patterns provided in the emission area.

18. The device with light emitting elements according to claim 6, wherein the third organic film is formed of a material different from that of the second organic film or is formed of the same material as the second organic film.

19. A method for manufacturing a device with light emitting elements, comprising:
    forming a light emitting element and a first organic film sequentially on a first substrate;
    forming a metal film and a second organic film sequentially on a second substrate;
    the first substrate on which the first organic film is formed and the second substrate on which the second organic film is formed are bonded to each other, and the first organic film of the first substrate and the second organic film of the second substrate are bonded to each other while facing each other, and
    the first organic film has a first modulus of elasticity;
    the second organic film has a second modulus of elasticity which is greater than the first modulus of elasticity; and
    the metal film has a third modulus of elasticity which is greater than the second modulus of elasticity.

20. The method according to claim 19,
    wherein the first substrate is divided into emission area and non-emission area, and
    wherein the second organic film is formed in patterns in a non-emission area, and the first organic film is interposed between the patterns of the second organic film to form a moisture absorbing pattern.

21. The method according to claim 20, wherein
    the moisture absorbing pattern and the first organic film are formed using the same material and the same process.

* * * * *